(12) United States Patent
Kum et al.

(10) Patent No.: US 12,369,484 B2
(45) Date of Patent: Jul. 22, 2025

(54) DISPLAY DEVICE

(71) Applicant: Samsung Display Co., Ltd., Yongin-si (KR)

(72) Inventors: Byung-Gon Kum, Hwaseong-si (KR); Gyusu Lee, Asan-si (KR); Jae-Hwan Jeon, Seongnam-si (KR); Da Wun Kim, Asan-si (KR); Hyunsu Park, Hwaseong-si (KR); Ji Sang Seo, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 490 days.

(21) Appl. No.: 17/718,790

(22) Filed: Apr. 12, 2022

(65) Prior Publication Data

US 2022/0416194 A1    Dec. 29, 2022

(30) Foreign Application Priority Data

Jun. 29, 2021 (KR) .................. 10-2021-0084562

(51) Int. Cl.
*H10K 50/84* (2023.01)
*H10K 50/115* (2023.01)
(Continued)

(52) U.S. Cl.
CPC ....... *H10K 59/8731* (2023.02); *H10K 50/115* (2023.02); *H10K 50/844* (2023.02);
(Continued)

(58) Field of Classification Search
CPC ........ H10K 50/84; H10K 50/85; H10K 50/87; H10K 50/115; H10K 50/8445; H10K 59/38; H10K 59/80; H10K 59/8722; H10K 59/8731; H10K 59/8794; H10K 50/844; H05K 7/20; H05K 7/20481; H05K 7/20954; H05K 7/20963; G09F 9/30
(Continued)

(56) References Cited

U.S. PATENT DOCUMENTS

| | | | |
|---|---|---|---|
| 8,584,743 B2 | 11/2013 | Moon et al. | |
| 2007/0114555 A1* | 5/2007 | Takemoto | G02B 6/0073 257/E25.02 |

(Continued)

FOREIGN PATENT DOCUMENTS

| | | |
|---|---|---|
| KR | 1020110044644 A | 4/2011 |
| KR | 101250449 B1 | 4/2013 |

(Continued)

*Primary Examiner* — Chuong A Luu
(74) *Attorney, Agent, or Firm* — CANTOR COLBURN LLP

(57) ABSTRACT

A display device includes a display panel and a heat radiation sheet disposed under the display panel, where a first region and a second region disposed outside the first region when viewed in a thickness direction thereof are defined in the heat radiation sheet. The heat radiation sheet includes a heat radiation layer disposed in the first region, a lower protective layer disposed under the heat radiation layer, where a plurality of openings is defined in the lower protective layer, and an upper protective layer disposed above the heat radiation layer and coupled to the lower protective layer in the second region.

20 Claims, 11 Drawing Sheets

(51) Int. Cl.
  *H10K 50/844* (2023.01)
  *H10K 50/87* (2023.01)
  *H10K 59/38* (2023.01)
  *H10K 59/80* (2023.01)
(52) U.S. Cl.
  CPC ............ *H10K 50/87* (2023.02); *H10K 59/38* (2023.02); *H10K 59/8722* (2023.02); *H10K 59/8794* (2023.02)
(58) Field of Classification Search
  USPC .......................................................... 257/40
  See application file for complete search history.

(56) References Cited

U.S. PATENT DOCUMENTS

| | | | |
|---|---|---|---|
| 2015/0333285 A1* | 11/2015 | Ogasawara | ............ H10K 50/87 257/40 |
| 2016/0007498 A1* | 1/2016 | Park | .................... H01L 23/3737 165/185 |
| 2021/0055817 A1 | 2/2021 | Shin et al. | |
| 2021/0104586 A1 | 4/2021 | Baek et al. | |
| 2021/0175462 A1* | 6/2021 | Shin | ...................... G06F 1/1601 |

FOREIGN PATENT DOCUMENTS

| | | | |
|---|---|---|---|
| KR | 1020130043720 A | 5/2013 | |
| KR | 101889226 B1 | 8/2018 | |
| KR | 1020190140795 A | 12/2019 | |
| KR | 1020200027760 A | 3/2020 | |
| KR | 1020200119749 A | 10/2020 | |
| KR | 1020210042195 A | 4/2021 | |

\* cited by examiner

DISPLAY DEVICE

This application claims priority to Korean Patent Application No. 10-2021-0084562, filed on Jun. 29, 2021, and all the benefits accruing therefrom under 35 U.S.C. § 119, the content of which in its entirety is herein incorporated by reference.

BACKGROUND

1. Field

The disclosure herein relates to a display device, and more particularly, to a display device including a heat radiation sheet.

2. Description of the Related Art

A display panel may be classified into a transmission display panel, which selectively transmits source light generated from a light source, and a light-emitting display panel, which generates source light from the display panel itself. The display panel may include different types of light control patterns according to pixels to generate a color image. A light control pattern may transmit only a partial wavelength range of source light or may change the color of the source light. A portion of the light control pattern may change the characteristics of light without changing the color of the source light.

A display device may further include a heat radiation sheet to radiate heat generated by the display panel to an outside. The heat radiation sheet is typically disposed under the display panel.

SUMMARY

The disclosure provides a display device having a reduced defect rate.

An embodiment of the invention provides a display device including: a display panel; and a heat radiation sheet disposed under the display panel, where a first region and a second region disposed outside the first region when viewed in a thickness direction thereof are defined in the heat radiation sheet. In such an embodiment, the heat radiation sheet includes a heat radiation layer disposed in the first region, a lower protective layer disposed under the heat radiation layer, where a plurality of openings is defined in the lower protective layer, and an upper protective layer disposed above the heat radiation layer and coupled to the lower protective layer in the second region.

In an embodiment, the first region may include an inner region in which the heat radiation layer is disposed and an outer region in which air is disposed.

In an embodiment, the heat radiation layer may include graphite.

In an embodiment, each of the lower protective layer and the upper protective layer may include a synthetic resin film and an adhesive layer disposed between the synthetic resin film and the heat radiation layer.

In an embodiment, the adhesive layer may contain a hot-melt resin.

In an embodiment, the adhesive layer may be a synthetic-resin-film urethane-based hot-melt adhesive layer, and the synthetic resin film may be an ethylene terephthalate film.

In an embodiment, the plurality of openings may include a plurality of rows of openings extending in a first direction.

In an embodiment, a maximum length of each of the plurality of openings may be about 1 mm or less.

In an embodiment, the lower protective layer may include a synthetic resin film in which first openings corresponding to the plurality of openings are defined, and an adhesive layer disposed between the synthetic resin film and the heat radiation layer.

In an embodiment, a partial region of the adhesive layer may be spaced apart from the heat radiation layer, and the partial region of the adhesive layer may overlap a corresponding first opening among the first openings.

In an embodiment, a maximum length of the partial region of the adhesive layer may be greater than a maximum length of the corresponding first opening.

In an embodiment, a second opening may be defined in a partial region of the adhesive layer, and the second opening may overlap a corresponding one of the first openings.

In an embodiment, each of the plurality of openings may include a first region extending in a first direction and a second region extending from the first region in a second direction crossing the first direction.

In an embodiment, the display panel may include a base substrate, a light-emitting element disposed on the base substrate, a light conversion pattern disposed on the light-emitting element, and a color filter disposed on the light conversion pattern.

In an embodiment, the display panel may include a first base substrate, a light-emitting element disposed on an upper surface of the first base substrate, a second base substrate disposed opposite to the first base substrate, a color filter disposed on the lower surface of the second base substrate, and a light conversion pattern disposed on a lower surface of the color filter.

In an embodiment, the heat radiation layer may have a porous structure.

In an embodiment of the invention, a display device may include a display panel and a heat radiation sheet attached to a lower surface of the display panel. In such an embodiment, the heat radiation sheet includes a graphite layer, a lower synthetic resin film under the graphite layer, an upper synthetic resin film above the graphite layer, and an adhesive member including a first portion disposed between the graphite layer and the lower synthetic resin film, a second portion disposed between the graphite layer and the upper synthetic resin film, and a third portion between the lower synthetic resin film and the upper synthetic resin film and not overlapping the graphite layer. In such an embodiment, a plurality of first openings is defined in the lower synthetic resin film.

In an embodiment, each of the first portion and the second portion may extend from the third portion.

In an embodiment, second openings corresponding to at least some of the plurality of first openings may be defined in the first portion.

In an embodiment, a side surface of the graphite layer may be exposed to an air pocket defined in the heat radiation sheet.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1A:
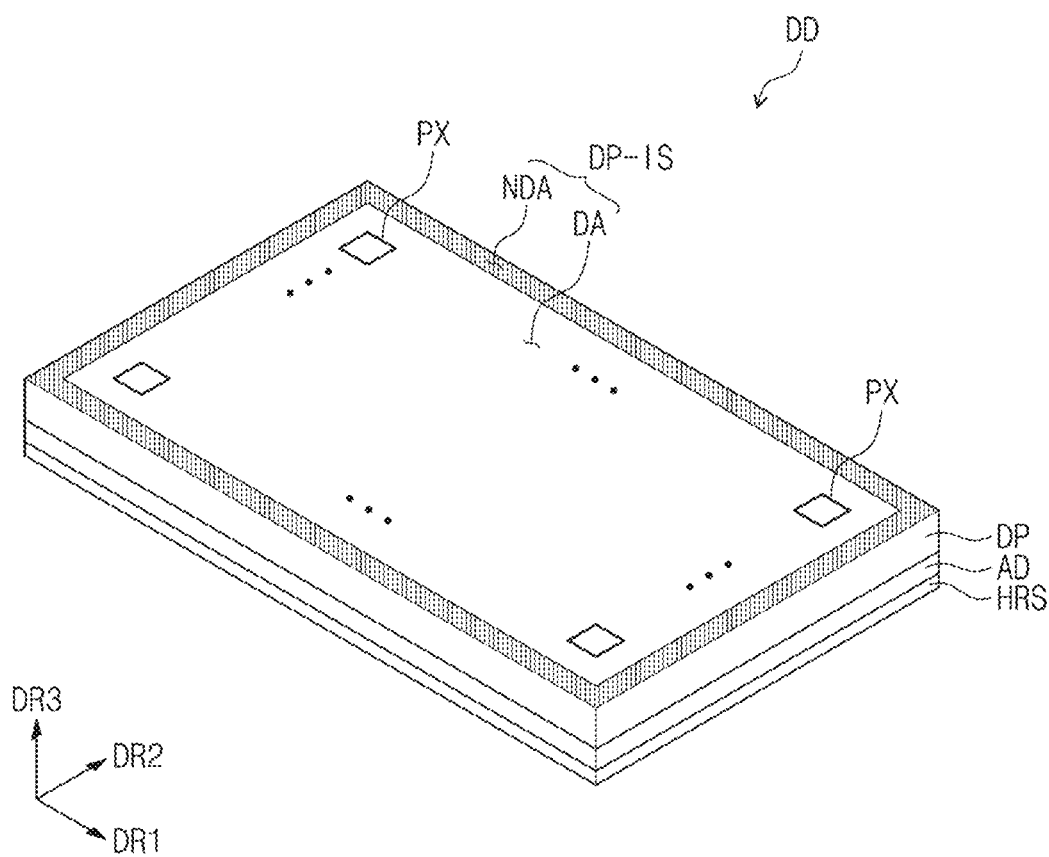
FIG. 1A is a perspective view of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will be understood that when an element (or region, layer, portion, etc.) is referred to as being "on", "connected to" or "coupled to" another element, it can be directly on, connected or coupled to the other element, or intervening elements may be present.

Like reference numerals refer to like elements throughout. In addition, in the drawings, the thicknesses, ratios, and dimensions of elements are exaggerated for effective description of the technical contents.

It will be understood that, although the terms first, second, etc. may be used herein to describe various elements, these elements should not be limited by these terms. These terms are only used to distinguish one element from another element. For example, a first element could be termed a second element without departing from the scope of the invention. Similarly, the second element may also be referred to as the first element. The terms of a singular form include plural forms unless otherwise specified.

Terms, such as "under", "lower", "above", "upper" and the like, are used herein for ease of description to describe one element's relation to another element(s) as illustrated in the figures. The above terms are relative concepts and are described based on the directions indicated in the drawings.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 1B:
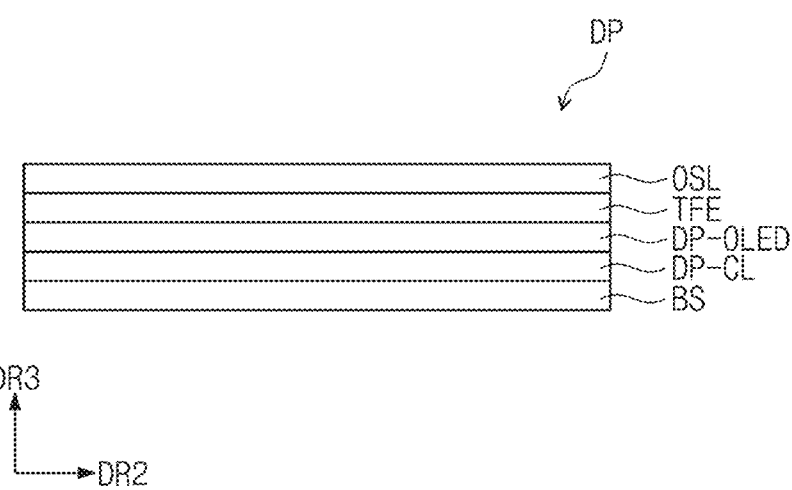
FIG. 1B is a cross-sectional view of a display panel according to an embodiment of the invention.
Figure 1C:
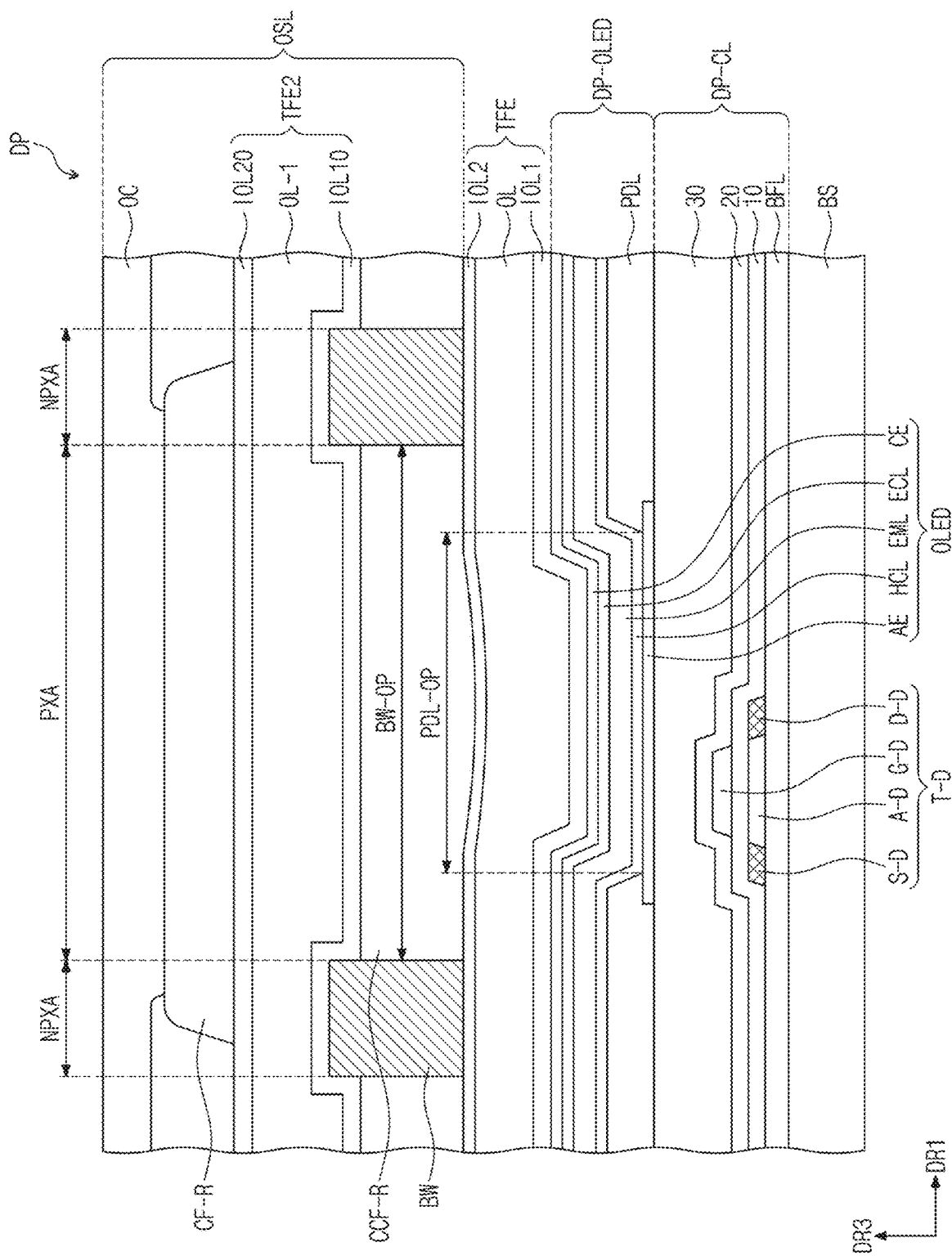
FIG. 1C is an enlarged cross-sectional view of the display panel according to an embodiment of the invention.

FIG. 1A is a perspective view of a display device DD according to an embodiment of the invention. FIG. 1B is a cross-sectional view of a display panel DP according to an embodiment of the invention. FIG. 1C is an enlarged cross-sectional view of the display panel DP according to an embodiment of the invention.

In an embodiment, as illustrated in FIG. 1A, the display device DD may include a display panel DP and a heat radiation sheet HRS disposed under the display panel DP. The heat radiation sheet HRS may be bonded to the lower surface of the display panel DP by an adhesive sheet AD. The adhesive sheet AD may include, for example, a pressure-sensitive adhesive layer, but the embodiment of the invention is not limited thereto.

The display panel DP is a light-emitting display panel and may be an inorganic light-emitting display panel or an organic light-emitting display panel, but the embodiment of the invention is not particularly limited.

In such an embodiment, as illustrated in FIG. 1A, the display panel DP may display an image through a display surface DP-IS. The upper surface of a member disposed on the uppermost side of the display panel DP may be defined as a display surface DP-IS. In an embodiment, as illustrated in FIG. 1B, the upper surface of a light control layer OSL may be defined as the display surface DP-IS of FIG. 1A.

The display surface DP-IS is parallel to a surface defined by a first direction axis DR1 and a second direction axis DR2. A third direction axis DR3 indicates a normal direction of the display surface DP-IS, that is, the thickness direction of the display panel DP. The upper surface (or a front surface) and the lower surface (or a rear surface) of each of the layers or units described below are divided by the third direction axis DR3. However, the first to third direction axes DR1, DR2, and DR3 illustrated in this embodiment are merely examples. Hereinafter, first to third directions are defined as directions indicated by the first to third direction axes DR1, DR2, and DR3, respectively, and labeled with the same reference numerals.

The display panel DP may include a display region DA and a non-display region NDA. A pixel PX is disposed in the display region DA, and the pixel PX is not disposed in the non-display region NDA. The non-display region NDA is defined along the edge of the display surface DP-IS. The non-display region NDA may surround the display region DA. In an embodiment of the invention, the non-display region NDA may be omitted or disposed only on one side of the display region DA.

In an embodiment of the invention, the display panel DP may have a flat display surface DP-IS as illustrated, but the embodiment of the invention is not limited thereto. The display panel DP may include a curved display surface or a three-dimensional display surface. The three-dimensional display surface may include a plurality of display regions indicating directions different from each other. In an embodiment, the display panel DP may be a rollable display panel, a foldable display panel, or a slidable display panel. The display panel DP may have a flexible property and may be folded or rolled.

The heat radiation sheet HRS may radiate heat generated by the display panel DP to the outside. The heat radiation sheet HRS may have substantially a same shape as the display panel DP and have substantially a same area as the display panel DP.

In an embodiment, as illustrated in FIG. 1B, the display panel DP includes a base substrate BS, a circuit element layer DP-CL disposed on the base substrate BS, a display element layer DP-OLED disposed on the circuit element layer DP-CL, an encapsulation layer TFE disposed on the display element layer DP-OLED, and a light control layer OSL disposed on the encapsulation layer TFE. The base substrate BS may include a glass substrate, a plastic substrate, or an organic/inorganic composite substrate. The circuit element layer DP-CL includes a signal line or a driving circuit of the pixel PX. The display element layer DP-OLED includes a light-emitting element disposed in each pixel PX. The encapsulation layer TFE includes at least one inorganic layer that seals the light-emitting element. The light control layer OSL converts the optical properties of light emitted from the light-emitting element.

Referring to FIG. 1C, the display region DA (refer to FIG. 1A) includes a pixel region PXA and a non-pixel region NPXA. A pixel region PXA is defined to correspond to a pixel PX (refer to FIG. 1A). A non-pixel region NPXA may be defined by a boundary area between a plurality of pixel regions PXA and prevent color mixing between the pixel regions PXA. In an embodiment, the pixel region PXA is defined to correspond to a second opening BW-OP which will be described later. The non-pixel region NPXA may be defined as a region in which a partition wall BW is disposed.

The plurality of pixel regions PXA may include a first pixel region for providing a first color light (e.g. red light), a second pixel region for providing a second color light (e.g. green light), and a third pixel region for providing a third color light (e.g. blue light). The main or primary three colors may be changed to other combinations, and the embodiment of the invention is not particularly limited. The pixel region PXA of FIG. 1C may be the first pixel region for providing red light. Since the cross-sectional structures of the first pixel region, the second pixel region, and the third pixel region are substantially the same as each other, only the first pixel region will be mainly described.

In FIG. 1C, a cross section of the display panel DP, which corresponds to a driving transistor T-D and a light-emitting element OLED, is illustrated for convenience of illustration. The display panel DP may further include a plurality of insulating layers, a semiconductor pattern, a conductive pattern, a signal line, and the like. In an embodiment, an insulating layer, a semiconductor layer, and a conductive layer may be formed through a coating process, a deposition process, and the like. Thereafter, the insulating layer, the semiconductor layer, and the conductive layer may be selectively patterned through photolithography and etching processes. In such an embodiment, the semiconductor pattern, the conductive pattern, the signal line, and the like, which are included in the circuit element layer DP-CL and the display element layer DP-OLED, may be formed as described above.

In an embodiment, the circuit element layer DP-CL may include a buffer layer BFL, a first insulating layer 10, a second insulating layer 20, and a third insulating layer 30. In an embodiment, for example, the buffer layer BFL, the first insulating layer 10, and the second insulating layer 20 may be inorganic layers, and the third insulating layer 30 may be an organic layer.

FIG. 1C illustrates an arrangement relationship of an active layer A-D, a source S-D, a drain D-D, and a gate G-D, which constitute the driving transistor T-D. The active layer A-D, the source S-D, and the drain D-D may be regions which are divided according to the doping concentration or conductivity of the semiconductor pattern.

The display element layer DP-OLED includes a light-emitting element OLED. The light-emitting element OLED may generate source light. The light-emitting element OLED includes a first electrode AE and a second electrode CE with a light-emitting layer EML interposed therebetween. In an embodiment, the display element layer DP-OLED may include an organic light-emitting diode as a light-emitting element. The display element layer DP-OLED includes a pixel defining layer PDL. In an embodiment, for example, the pixel defining layer PDL may be an organic layer. The pixel defining layer PDL may include a typical black coloring agent. The pixel defining layer PDL may include a black pigment and a black dye mixed with a base resin. In an embodiment of the invention, the black coloring agent may include carbon black, a metal such as chromium, or an oxide thereof.

The first electrode AE is disposed on the third insulating layer 30. The first electrode AE is directly connected to the driving transistor T-D or is connected thereto through another structure (e.g. a transistor). A connection structure between the first electrode AE and the driving transistor T-D is not illustrated in FIG. 1C. A first opening PDL-OP is defined in the pixel defining layer PDL. The first opening PDL-OP exposes at least a portion of the first electrode AE.

A hole control layer HCL, a light-emitting layer EML, and an electron control layer ECL may be commonly disposed in the pixel region PXA and the non-pixel region NPXA. The hole control layer HCL, the light-emitting layer EML, and the electron control layer ECL may be commonly disposed in the plurality of pixels PX (refer to FIG. 1A).

The hole control layer HCL may include a hole transport layer and may further include a hole injection layer. The light-emitting layer EML may generate blue light as source light. The blue light may include a wavelength of about 410 nanometers (nm) to about 480 nm. The light-emitting spectrum of the blue light may have a peak wavelength in a range of about 440 nm to about 460 nm. The electron control layer ECL may include an electron transport layer and may further include an electron injection layer. The second electrode CE is disposed on the electronic control layer ECL. The second electrode CE may be commonly disposed in the plurality of pixels PX (refer to FIG. 1A).

An encapsulation layer TFE for sealing the light-emitting element OLED may be disposed on the second electrode CE. The encapsulation layer TFE includes at least one inorganic layer. The encapsulation layer TFE may have a multi-layered structure in which inorganic/organic layers are repeatedly stacked one on another. In an embodiment, the encapsulation layer TFE may include a structure of a first inorganic encapsulation layer IOL1/an organic encapsulation layer OL/a second inorganic encapsulation layer IOL2. The first and second inorganic encapsulation layers IOL1 and IOL2 may protect the light-emitting element OLED from external moisture, and the organic encapsulation layer OL may prevent an imprint defect in the light-emitting element OLED from occurring due to foreign substances introduced during a manufacturing process. Although not illustrated, the display panel DP may further include a refractive index control layer above the encapsulation layer TFE to improve light-emitting efficiency.

In an embodiment, as illustrated in FIG. 1C, the light control layer OSL is disposed on the encapsulation layer TFE. The light control layer OSL may include a partition wall BW, a light control pattern CCF-R, an upper encapsulation layer TFE2, a color filter CF-R, and a protective layer OC.

The partition wall BW may include a base resin and an additive. The base resin may include or be composed of various resin compositions, which may be generally referred to as binders. The additive may include a coupling agent and/or a photoinitiator. The additive may further include a dispersant.

The partition wall BW may include a black coloring agent to block light. The partition wall BW may include a black pigment and a black dye mixed with a base resin. In an embodiment of the invention, the black coloring agent may include carbon black, a metal such as chromium, or an oxide thereof.

The second opening BW-OP corresponding to the first opening PDL-OP is defined in the partition wall BW. On a plane (or when viewed in the third direction DR3), the second opening BW-OP overlaps the first opening PDL-OP and has a larger area than the first opening PDL-OP.

The light control pattern CCF-R is disposed inside the second opening BW-OP. The light control pattern CCF-R may change the optical properties of source light. In an embodiment, the light control patterns CCF-R of the first and second pixel regions may be color conversion patterns which may convert a color of the source light to provide light having a color different from that of the source light. The color conversion pattern of the first pixel region may convert blue source light into red light, and the color conversion pattern of the second pixel region may convert blue source light into green light. The light control pattern CCF-R of the third pixel region may be a transmission pattern. The light control pattern CCF-R of the third pixel region may scatter and then emit received blue light including scattering particles. The light control pattern CCF-R may improve the luminance of emitted light compared to incident light.

The color conversion pattern may include a base resin and quantum dots mixed (or dispersed) with the base resin. In an embodiment, the color conversion pattern may include quantum dots and, in such an embodiment, the color conversion pattern may be defined as a quantum dot pattern, and the color conversion patterns of the first pixel region and the second pixel region include quantum dots different from each other. The base resin is a medium, in which quantum dots are dispersed, and may include or be composed of various resin compositions that may be generally referred to as binders. However, the embodiment of the invention is not limited thereto, and herein, the medium may be referred to as a base resin regardless of the name, other additional functions, and the constituent materials thereof as long as a medium is capable of dispersing quantum dots. The base resin may be a polymer resin. In an embodiment, for example, the base resin may be an acrylic-based resin, a urethane-based resin, a silicone-based resin, or an epoxy-based resin. The base resin may be a transparent resin.

The color conversion pattern may further include scattering particles mixed with the base resin like the above-described transmission pattern. The scattering particles may be titanium oxide ($TiO_2$)-based nanoparticles, silica-based nanoparticles, or the like.

The quantum dots may be particles that convert the wavelength of incident light. The quantum dots are substances having a crystal structure of several nanometers in size, are composed of hundreds to thousands of atoms, and exhibit a quantum confinement effect in which an energy band gap becomes larger due to the small sizes thereof. When light with a wavelength having a higher energy than the band gap is incident on the quantum dots, the quantum dots absorb the light to enter an excited state, and fall to a ground state while emitting light with a specific wavelength. The energy of the emitted light has a value corresponding to the band gap. By adjusting the size and composition of the quantum dots, the luminescence properties thereof due to the quantum confinement effect may be adjusted.

The quantum dots may be selected from a Group II-VI compound, a Group I-III-VI compound, a Group III-V compound, a Group IV-VI compound, a Group IV element, a Group IV compound, and combinations thereof.

The Group II-VI compound may be selected from: a binary compound selected from CdSe, CdTe, CdS, ZnS, ZnSe, ZnTe, ZnO, HgS, HgSe, HgTe, MgSe, MgS, and mixtures thereof; a ternary compound selected from AgInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The Group I-III-VI compound may be selected from a ternary compound selected from $AgInS_2$, $CuInS_2$, $AgGaS_2$, $CuGaS_2$, and mixtures thereof, or a quaternary compound such as $AgInGaS_2$ and $CuInGaS_2$.

The Group III-V compound may be selected from a group consisting of: a binary compound selected from GaN, GaP, GaAs, GaSb, AlN, AlP, AlAs, AlSb, InN, InP, InAs, InSb, and mixtures thereof; a ternary compound selected from GaNP, GaNAs, GaNSb, GaPAs, GaPSb, AlNP, AlNAs, AlNSb, AlPAs, AlPSb, InGaP, InAlP, InNP, InNAs, InNSb, InPAs. InPSb, and mixtures thereof; and a quaternary compound selected from GaAlNP, GaAlNAs, GaAlNSb, GaAlPAs, GaAlPSb. GaInNP, GaInNAs, GaInNSb, GaInPAs, GaInPSb, InAlNP, InAlNAs, InAlNSb, InAlPAs, InAlPSb, and mixtures thereof. The Group III-V compound may further include a Group II metal. In an embodiment, for example, InZnP or the like may be selected as a Group III-II-V compound.

The Group IV-VI compound may be selected from: a binary compound selected from SnS, SnSe, SnTe, PbS, PbSe, PbTe, and mixtures thereof: a ternary compound selected from SnSeS, SnSeTe, SnSTe, PbSeS, PbSeTe, PbSTe, SnPbS, SnPbSe, SnPbTe, and mixtures thereof; and a quaternary compound selected from SnPbSSe, SnPbSeTe, SnPbSTe, and mixtures thereof. The Group IV element may be selected from Si, Ge, and a mixture thereof. The Group IV compound may be a binary compound selected from SiC, SiGe, and a mixture thereof.

In this case, the binary compound, the ternary compound, or the quaternary compound may exist in a particle at a uniform concentration, or may exist in a same particle in a state in which concentration distribution is partially different.

The quantum dots may have a core-shell structure including a core and a shell surrounding the core. Alternatively, the quantum dots may have another core-shell structure in which one quantum dot surrounds another quantum dot. The interface between the core and the shell may have a concentration gradient in which the concentration of an element present in the shell becomes lower toward the core.

The quantum dots may be particles having a nanometer-scale size. In an embodiment, the light-emitting wavelength spectrum of the quantum dots may have a full width at half maximum ("FWHM") of about 45 nm or less, e.g., about 40 nm or less, or about 30 nm or less, such that color purity or color reproducibility may be improved. In such an embodiment, since light emitted through these quantum dots is emitted in all directions, a wide viewing angle may be improved.

In an embodiment, the shapes of the quantum dots are not particularly limited to those generally used in the art, but more specifically, a nano-particle, a nano-tube, a nano-wire, a nano-fiber, a nano-plate particle, or the like having a spherical shape, a pyramidal shape, a multi-arm shape, or a cubic shape may be used. The color of light which is emitted may be controlled according to a particle size of the quantum dot, and accordingly, the quantum dot may emit light having various colors, such as red light, green light, and blue light.

In an embodiment, the light control pattern CCF-R may be formed through an inkjet process. A liquid composition is provided in the second opening BW-OP. The composition polymerized through a thermal curing process or a light curing process is reduced in volume while being cured. A step difference is formed between the upper surface of the partition wall BW and the upper surface of the light control pattern CCF-R. The height difference between the upper surface of the partition wall BW and the upper surface of the light control pattern CCF-R may be about 2 µm to about 3 µm.

An upper encapsulation layer TFE2 overlapping the light control pattern CCF-R is disposed on the partition wall BW. The upper encapsulation layer TFE2 may include a first inorganic encapsulation layer IOL10/an organic encapsulation layer OL-1/a second inorganic encapsulation layer IOL20. The first and second inorganic encapsulation layers IOL10 and IOL20 protect the light control pattern CCF-R from external moisture, and the organic encapsulation layer OL-1 removes step differences defined by the partition wall BW and the light control pattern CCF-R and provides a flat base surface to a member to be disposed above.

Each of the first inorganic encapsulation layer IOL10 and the second inorganic encapsulation layer IOL20 may include at least one selected from silicon oxide, silicon oxynitride, and silicon nitride. The organic encapsulation layer OL-1 may contain an organic material, for example, an acrylic-based organic material.

A color filter CF-R is disposed on the upper encapsulation layer TFE2. The color filter CF-R transmits light in a specific wavelength range and blocks light outside the corresponding wavelength range. The color filter CF-R of the first pixel region may transmit red light and block green light and blue light.

The color filter CF-R includes a base resin, and a dye and/or a pigment dispersed in the base resin. The base resin is a medium, in which a dye and/or a pigment are dispersed, and may be composed of various resin compositions, which may be generally referred to as binders.

The color filter CF-R disposed on a flat surface formed as a result of removing a step difference by the organic encapsulation layer OL-1 may have a uniform thickness in the pixel region PXA. Red light generated in the light control pattern CCF-R may have a uniform luminance in the pixel region PXA and may be provided to the outside.

A protective layer OC is disposed on the color filter CF-R. The protective layer OC may be an organic layer that protects the color filters CF-R. The protective layer OC may contain a photo-curable organic material or a heat-curable organic material.

According to an embodiment of the invention, a protective glass substrate may be further disposed on the protective layer OC. An adhesive layer may be disposed between the protective layer OC and the glass substrate. In an embodiment of the invention, the protective layer OC may contain an inorganic material.

Figure 2:
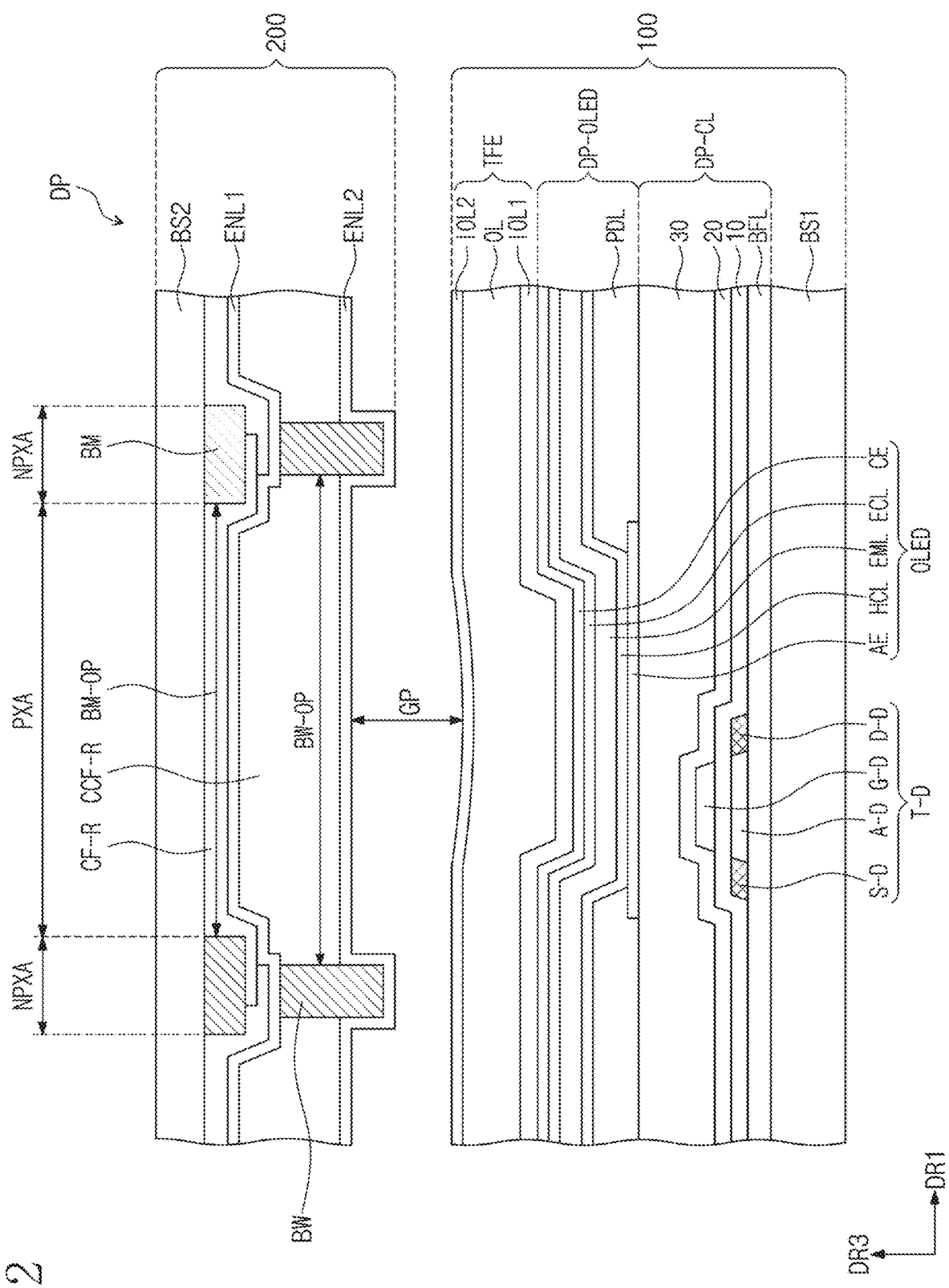
FIG. 2 is an enlarged cross-sectional view of a display panel according to an embodiment of the invention.

FIG. 2 is an enlarged cross-sectional view of a display panel DP according to an embodiment of the invention. Hereinafter, any repetitive detailed description of a same or like elements of FIG. 2 as those described above with reference to FIGS. 1A to 1C will be omitted or simplified.

Referring to FIG. 2, an embodiment of the display panel DP may include a first display substrate 100 (or a lower display substrate) and a second display substrate 200 (or an upper display substrate), which faces and is spaced apart from the first display substrate 100. A predetermined cell gap GP may be formed between the first display substrate 100 and the second display substrate 200. The cell gap GP may be maintained by a sealant (not illustrated) which couples the first display substrate 100 and the second display substrate 200 to each other. The sealant may be disposed in the non-display region NDA illustrated in FIG. 1A. In an embodiment of the invention, a synthetic resin material may be disposed in the cell gap GP.

The first display substrate 100 may have substantially the same structure as a structure described with reference to FIG. 1C except that the light control layer OSL is omitted from the display panel DP. The light control layer OSL may be implemented as a second display substrate 200 to be described later. In such an embodiment, however, the base substrate BS of FIG. 1C is defined as a first base substrate BS1.

The second display substrate 200 may include a second base substrate BS2 disposed to be spaced apart from the first base substrate BS1, a partition pattern BM disposed on the lower surface of the second base substrate BS2, a color filter CF-R, and a color control layer CCF-R. In such an embodiment, the second display substrate 200 may further include a plurality of encapsulation layers ENL1, ENL2, and ENL3.

The second base substrate BS2 may include a synthetic resin substrate or a glass substrate. The partition pattern BM is disposed on the lower surface of the second base substrate BS2. The partition pattern BM is disposed in the non-pixel region NPXA. In an embodiment, an opening BM-OP corresponding to the pixel region PXA is defined in the partition pattern BM.

In an embodiment, the partition pattern BM is a pattern having a black color and may be a black matrix. The partition pattern BM may contain a black coloring agent. The black coloring agent may contain a black dye and a black pigment. The black coloring agent may contain carbon black, a metal such as chromium, or an oxide thereof.

The opening BM-OP defined in the partition pattern BM may be defined differently based on the optical properties of the partition pattern BM. In an embodiment, an opening corresponding to each of the first to third pixel regions is defined in the partition pattern BM that blocks most of the entire wavelength band of visible light. In an embodiment, where the partition pattern BM transmits any one or more specific color lights (e.g. red light, green light, or blue light), a smaller number of openings may be defined. In such an embodiment, the partition pattern BM, which transmits specific color light, may correspond to a color filter to be described later.

The color filter CF-R is disposed on the lower surface of the base substrate BS2. The edge region of the color filter CF-R may overlap the non-pixel region NPXA. A portion of the partition pattern BM may be disposed between the color filter CF-R and the lower surface of the base substrate BS2.

A first encapsulation layer ENL1 is disposed under the color filter CF-R. The first encapsulation layer ENL1 seals the color filter CF-R. The first encapsulation layer ENL1 may be commonly disposed in the first to third pixel regions. The color control layer CCF-R is disposed on the lower surface of the first encapsulation layer ENL1 so as to correspond to the color filter CF-R.

The partition wall BW may be disposed under the first encapsulation layer ENL1. The color control layer CCF-R is disposed inside the opening BW-OP of the partition wall BW. A second encapsulation layer ENL2 may seal the color control layer CCF-R. The first encapsulation layer ENL1 and the second encapsulation layer ENL2 may include an inorganic layer. The inorganic layer may include at least one selected from silicon oxide, silicon nitride, and silicon oxy nitride.

Figure 3A:
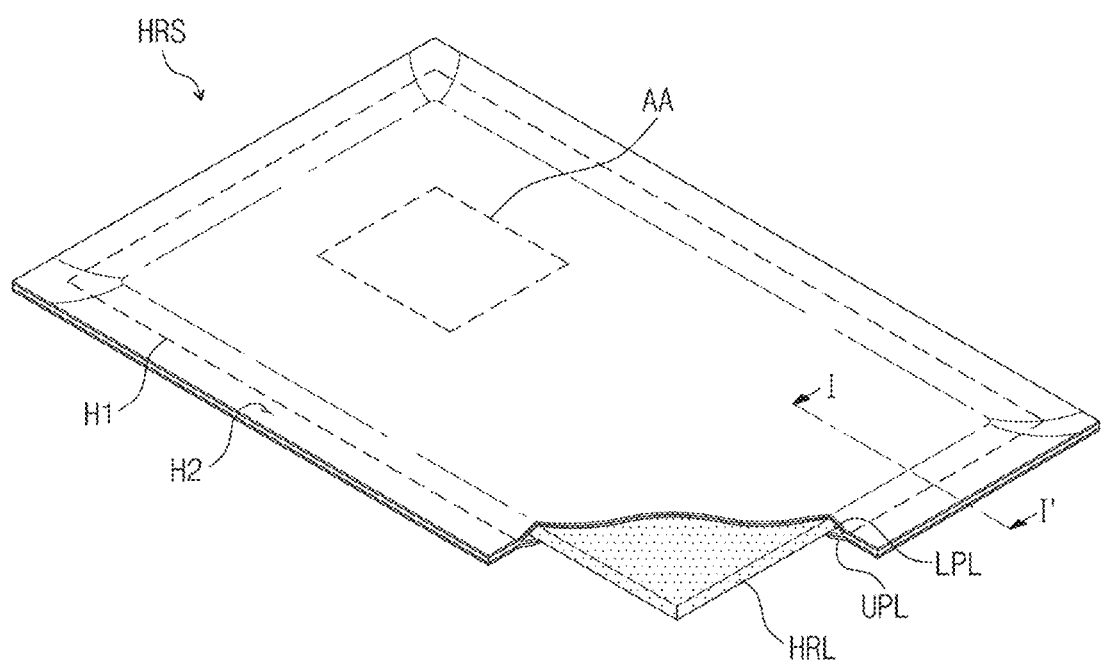
FIG. 3A is a perspective view of a heat radiation sheet according to an embodiment of the invention.
Figure 3A:
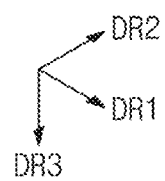
Figure 3B:
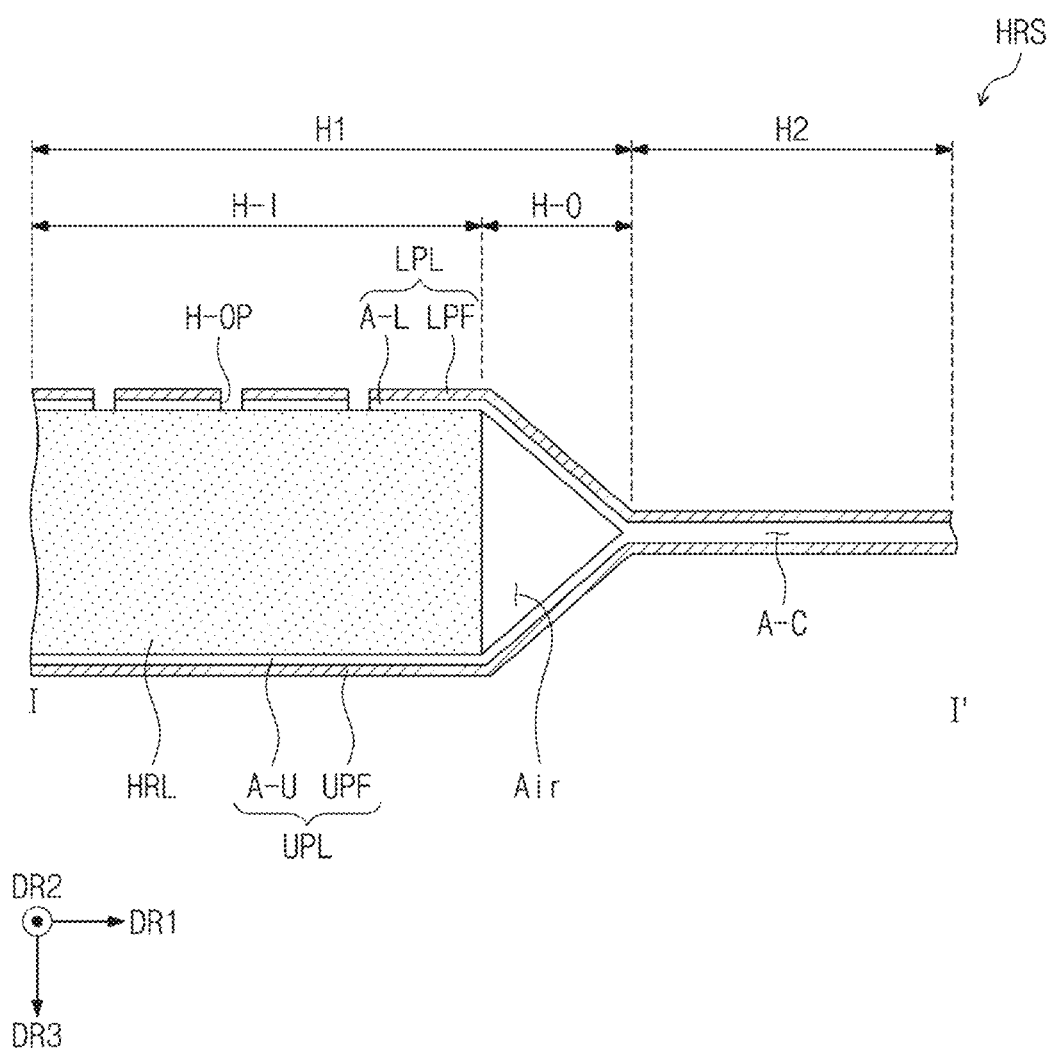
FIG. 3B is an enlarged plan view of the heat radiation sheet according to an embodiment of the invention.
Figure 3C:
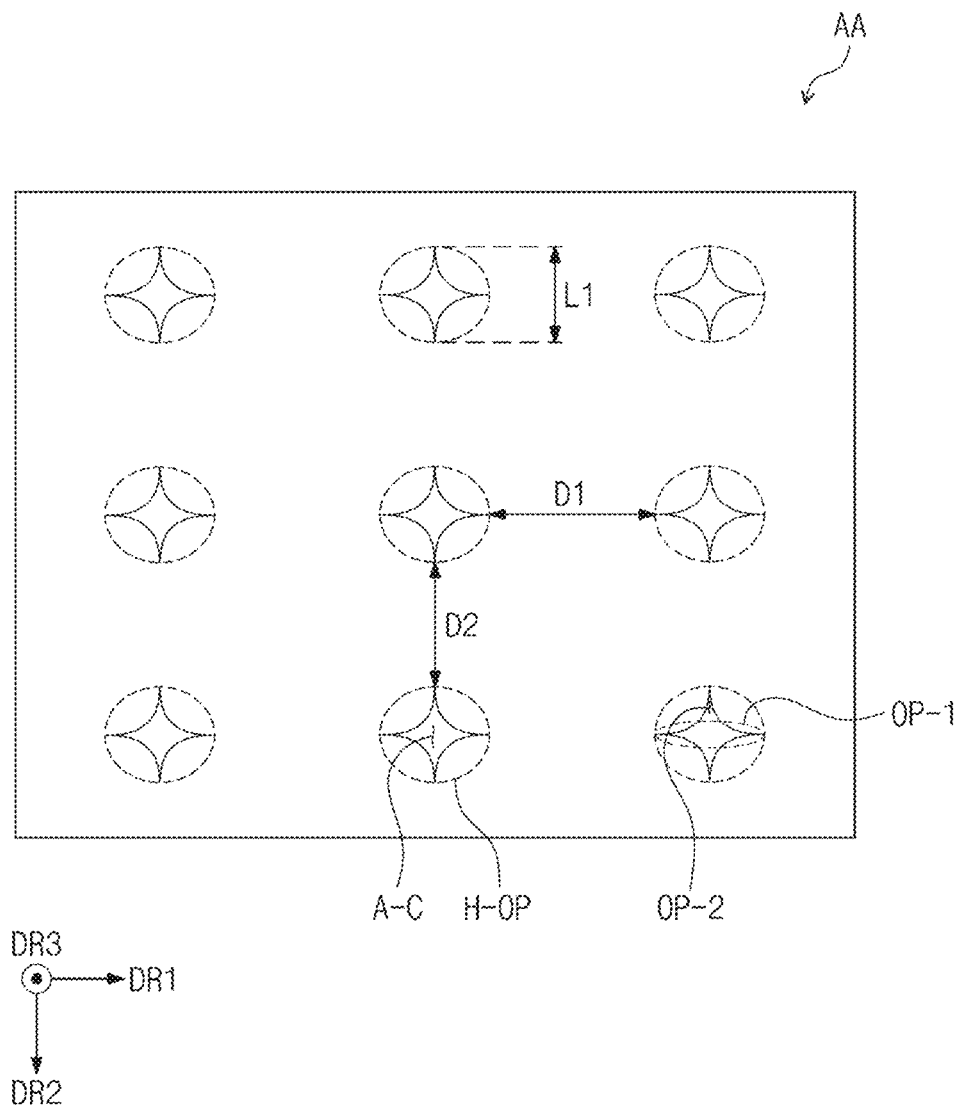
FIG. 3C is a cross-sectional view of the heat radiation sheet according to an embodiment of the invention.

FIG. 3A is a perspective view of a heat radiation sheet HRS according to an embodiment of the invention. FIG. 3B is an enlarged plan view of the heat radiation sheet HRS according to an embodiment of the invention. FIG. 3C is a cross-sectional view of the heat radiation sheet HRS according to an embodiment of the invention.

The upper surface of the heat radiation sheet HRS illustrated in FIGS. 3A to 3C corresponds to the lower surface of the heat radiation sheet HRS illustrated in FIG. 1A. Although illustrated as an upper side or an upper surface in FIGS. 3A to 3C, the upper surface of the heat radiation sheet HRS will be described as a lower side or a lower surface for consistency with FIG. 1A, and although illustrated as a lower side or a lower surface in FIGS. 3A to 3C, the lower surface of the heat radiation sheet HRS will be described as an upper side or an upper surface for consistency with FIG. 1A.

In an embodiment, as illustrated in FIG. 3A, on a plane, the heat radiation sheet HRS includes a first region H1 and a second region H2 disposed outside the first region H1. The second region H2 is a region in which encapsulation is formed or a region defined by an encapsulation structure, and the first region H1 is a region other than the second region H2.

In an embodiment, as illustrated in FIGS. 3A and 3B, the heat radiation sheet HRS includes a heat radiation layer HRL, an upper protective layer UPL, and a lower protective layer LPL. The heat radiation layer HRL is disposed in the first region H1. The first region H1 may include an inner region H-I in which the heat radiation layer HRL is disposed and an outer region H-O in which air is disposed. In such an embodiment, the outer region H-O corresponds to an air bag. In an alternative embodiment of the invention, the outer region H-O in which air is disposed may be omitted.

The heat radiation layer HRL may include a material having relatively high thermal conductivity, such as a tungsten-copper composite material, a molybdenum-copper composite material, or graphite. In an embodiment, the heat radiation layer HRL may have a porous structure. In an embodiment, the heat radiation layer HRL may include a graphite layer. In such an embodiment, the thickness of the graphite layer may be in a range of about 500 micrometers (µm) to about 1000 µm.

The upper protective layer UPL and the lower protective layer LPL seal the heat radiation layer HRL to prevent the particles of the heat radiation layer HRL from contaminating the outside. The upper protective layer UPL and the lower protective layer LPL protect the heat radiation layer HRL from external impact.

Referring to FIG. 3B, the upper protective layer UPL is disposed on the heat radiation layer HRL and is coupled to the lower protective layer LPL in the second region H2. The upper protective layer UPL includes an upper synthetic resin film UPF and an upper adhesive layer A-U disposed between the upper synthetic resin film UPF and the heat radiation layer HRL in the first region H1.

The lower protective layer LPL is disposed under the heat radiation layer HRL, and a plurality of openings H-OP is defined in the lower protective layer LPL. The lower protective layer LPL includes a lower synthetic resin film LPF and a lower adhesive layer A-L disposed between the lower synthetic resin film LPF and the heat radiation layer HRL in the first region H1.

The openings H-OP are defined through at least the lower synthetic resin film LPF. FIG. 3B illustrates an embodiment where the openings H-OP are defined through both the lower synthetic resin film LPF and the lower adhesive layer A-L. The openings H-OP will be described later in greater detail.

The upper synthetic resin film UPF and the lower synthetic resin film LPF may include at least one selected from an acetal-based resin, an acrylic-based resin, a carbonate-based resin, an ethylene-based resin, and an imide-based resin. In an embodiment, the upper synthetic resin film UPF and the lower synthetic resin film LPF may be ethylene terephthalate films. In an embodiment, each of the upper synthetic resin film UPF and the lower synthetic resin film LPF may have a thickness in a range of about 15 μm to about 50 μm.

The upper adhesive layer A-U and the lower adhesive layer A-L may be exposed to air inside the heat radiation sheet HRS in the outer region H-O. The upper adhesive layer A-U and the lower adhesive layer A-L may be adhesive layers (hereinafter, referred to as a hot-melt adhesive layer) including a hot-melt resin. The hot-melt adhesive layer may increase the strengths of the upper protective layer UPL and the lower protective layer LPL, when compared to an embodiment where each of the upper adhesive layer A-U and the lower adhesive layer A-L is a pressure-sensitive adhesive layer. In an embodiment, the upper adhesive layer A-U and the lower adhesive layer A-L may be synthetic-resin-film urethane-based hot-melt adhesive layers. In an embodiment, each of the upper adhesive layer A-U and the lower adhesive layer A-L may have a thickness in a range of about 15 μm to about 30 μm.

In the second region H2, the upper adhesive layer A-U and the lower adhesive layer A-L may define one adhesive layer A-C. In an embodiment where the upper protective layer UPL and the lower protective layer LPL seal the heat radiation layer HRL, one adhesive layer may be defined since the upper adhesive layer A-U and the lower adhesive layer A-L are compressed at a high temperature and then solidified to each other while being cooled.

Since the upper adhesive layer A-U and the lower adhesive layer A-L have an integral shape in the second region H2, the heat radiation sheet HRS may be described as a single adhesive member having an integral shape. The adhesive member is disposed between the upper synthetic resin film UPF and the heat radiation layer HRL and includes a first portion, in which the upper synthetic resin film UPF and the heat radiation layer HRL are coupled to each other, and a second portion disposed between the lower synthetic resin film LPF and the heat radiation layer HRL. The adhesive member may include a third portion in which the upper synthetic resin film UPF and the lower synthetic resin film LPF are coupled to each other outside the heat radiation layer HRL.

In an embodiment, as illustrated in FIG. 3C, the plurality of openings H-OP may include a plurality of rows of openings extending in the first direction DR1. The plurality of rows of openings may be arranged along the second direction DR2 crossing the first direction DR1.

Although FIG. 3C illustrates an embodiment where a plurality of openings H-OP is regularly or linearly arranged, the embodiment of the invention is not limited thereto. The plurality of openings H-OP may be arranged in an oblique direction or may be alternately arranged. In an embodiment of the invention, the plurality of openings H-OP may be randomly arranged.

In an embodiment, in a state in which the lower adhesive layer A-L is formed on one surface of the lower synthetic resin film LPF, a plurality of openings H-OP may be formed in the lower protective layer LPL by using a jig having a plurality of needles disposed therein. The arrangement of the plurality of openings H-OP may be determined based on the arrangement of the needles, and the shapes of the openings H-OP may be determined according to the shapes of the needles.

The openings H-OP formed by using cross-shaped needles are illustrated in FIG. 3C. Each of the openings H-OP may include a first region OP-1 extending in the first direction DR1 and a second region OP-2 extending from the first region in the second direction DR2. The maximum length of the first region OP-1 or the second region OP-2 in each extending direction may be about 1 mm or less. A region in which the opening H-OP is disposed is defined as an opening region H-OA, and the maximum length L1 of the opening region H-OA may be about 1 mm or less. If the length of the opening region H-OA is greater than about 1 mm, the particles of the graphite layer may be discharged to the outside through the opening H-OP. The particles of the graphite layer may correspond to foreign substances in the display device.

In an embodiment, it is desirable that a distance D1 in the first direction DR1 or a distance D2 in the second direction DR2 between the most adjacent opening regions H-OA is about 10 mm or less. In an embodiment where the maximum length L1 of the opening region H-OA is set to about 1 mm or less, it is desirable that the distance between the most adjacent opening regions H-OA is about 10 mm or less such that the opening region H-OA may properly perform a function to be described later with reference to FIGS. 4A and 4B.

Figure 4A:
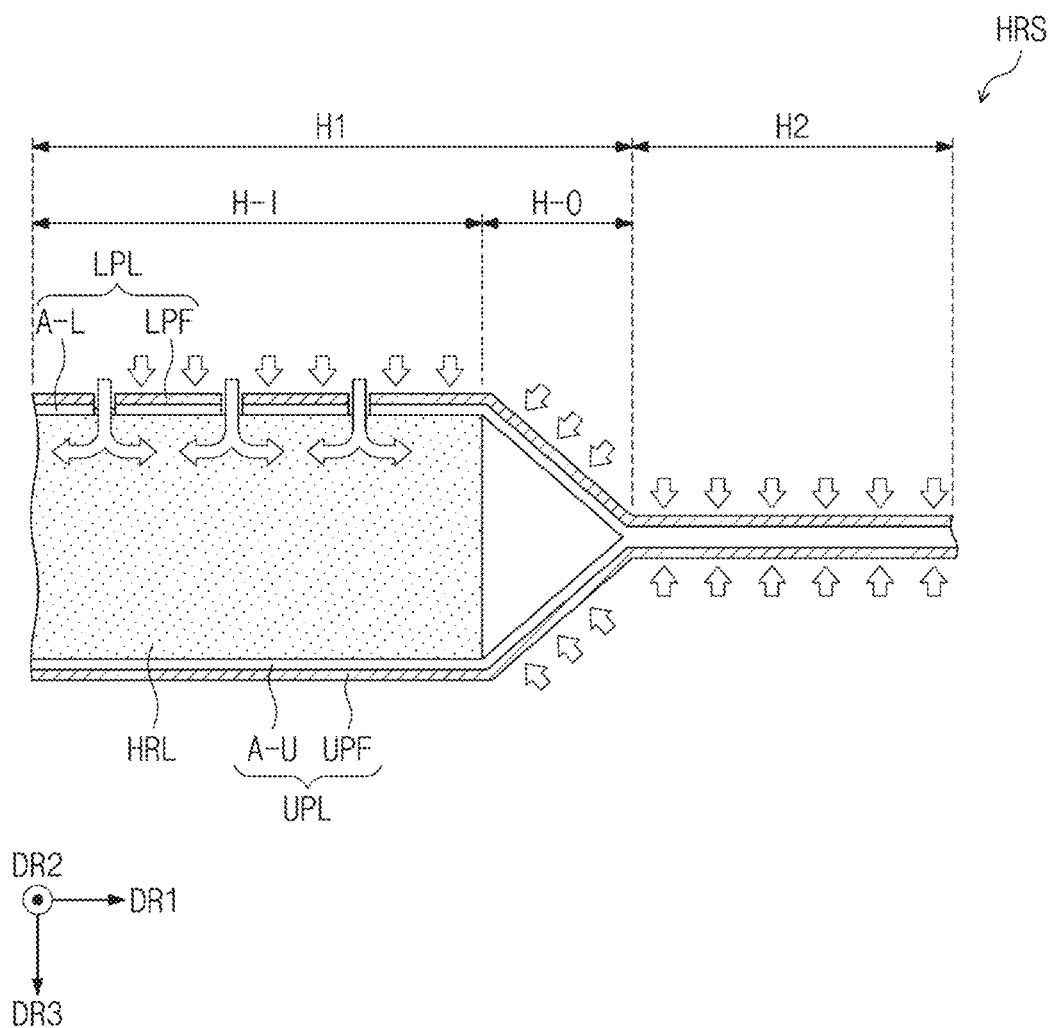
FIGS. 4A and 4B are cross-sectional views illustrating changes according to pressures of the heat radiation sheet according to an embodiment of the invention.
Figure 4B:
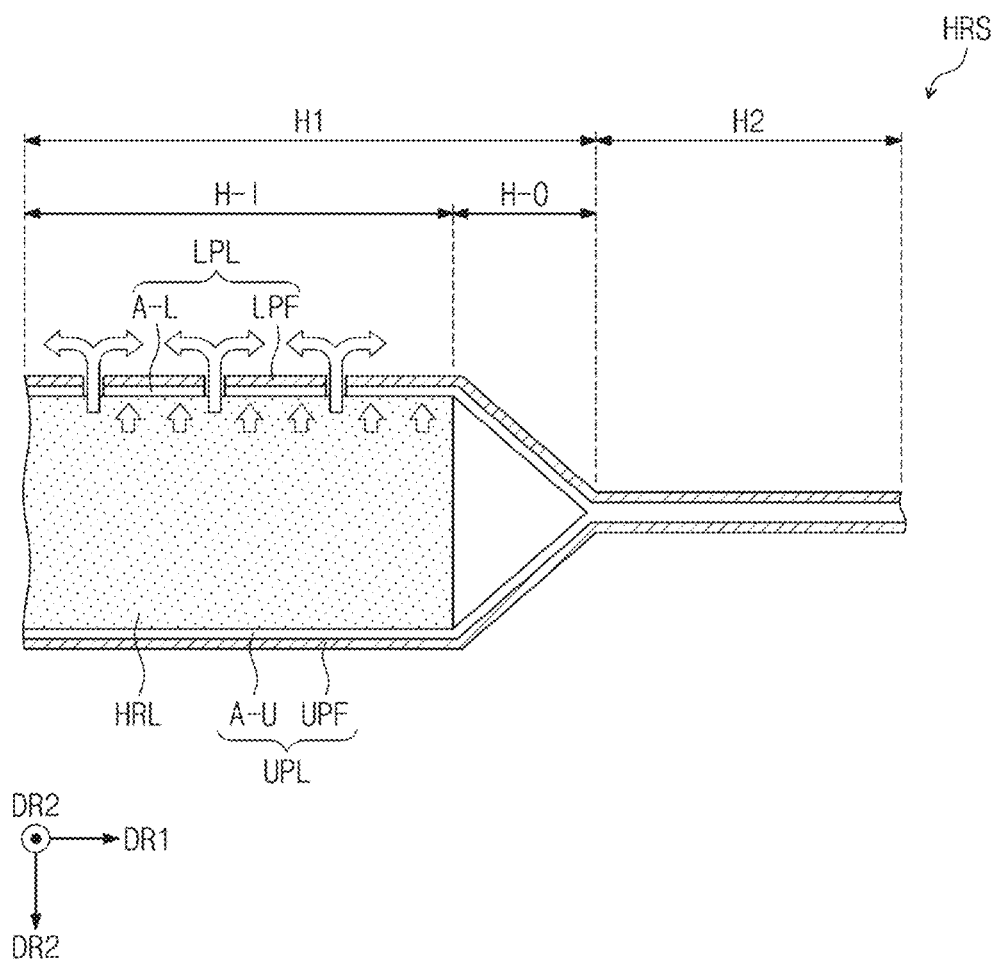

FIGS. 4A and 4B are cross-sectional views illustrating changes according to pressures of the heat radiation sheet HRS according to an embodiment of the invention.

In an embodiment, an autoclave process may be performed during a manufacturing process of the display device DD illustrated in FIG. 1A. In the autoclave process, temperature and pressure are increased during a first section, a predetermined temperature and a predetermined pressure are maintained during a second section, and then the temperature and the pressure are decreased during a third section.

FIG. 4A shows pressure exerted on the heat radiation sheet HRS during the first section and the second section. FIG. 4B shows pressure exerted on the heat radiation sheet HRS during the third section. During transition from the first section to the third section, a phenomenon in which air is concentrated on a region having weak adhesive strength between the lower protective layer LPL and the heat radiation layer HRL may occur. A large pressure change may occur in a region adjacent to the outer region H-O between the lower protective layer LPL and the heat radiation layer HRL. Such a pressure change may detach the lower protective layer LPL from the heat radiation layer HRL.

According to an embodiment of the invention, the plurality of openings H-OP may reduce a pressure difference between the outside and inside of the heat radiation sheet HRS. In such an embodiment, since air moves to the inside of a porous layer such as a graphite layer, the pressure difference between the outside and inside of the heat radiation sheet HRS may be further reduced. Accordingly, in a partial region (or a portion) of the inner region H-I adjacent to the outer region H-O, a defect in which the lower protective layer LPL is detached from the heat radiation layer HRL may be prevented.

In a process of transporting the display device DD by air, a pressure change opposite to that illustrated in FIGS. 4A and 4B may occur. In such a process, in a partial region of the inner region H-I adjacent to the outer region H-O, a defect in which the lower protective layer LPL is detached from the heat radiation layer HRL may also occur. According to this embodiment, however, the above-described defect may be prevented since the pressure difference between the outside and inside of the heat radiation sheet HRS is reduced by the plurality of openings H-OP.

Figure 5A:
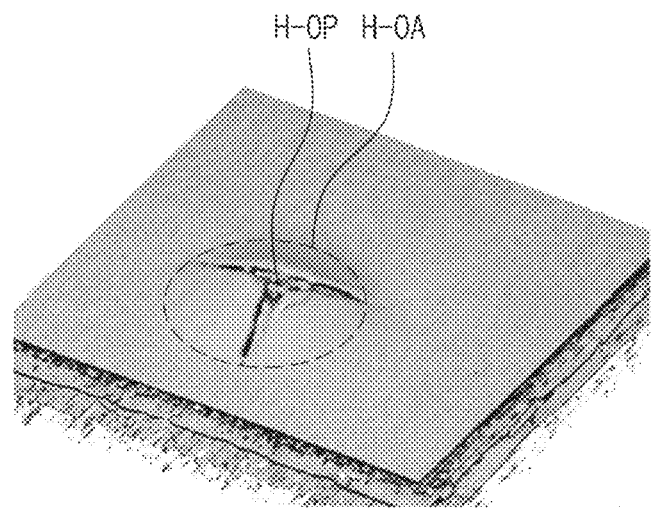
FIG. 5A is an enlarged perspective view of an opening region of the heat radiation sheet according to an embodiment of the invention.
Figure 5B:
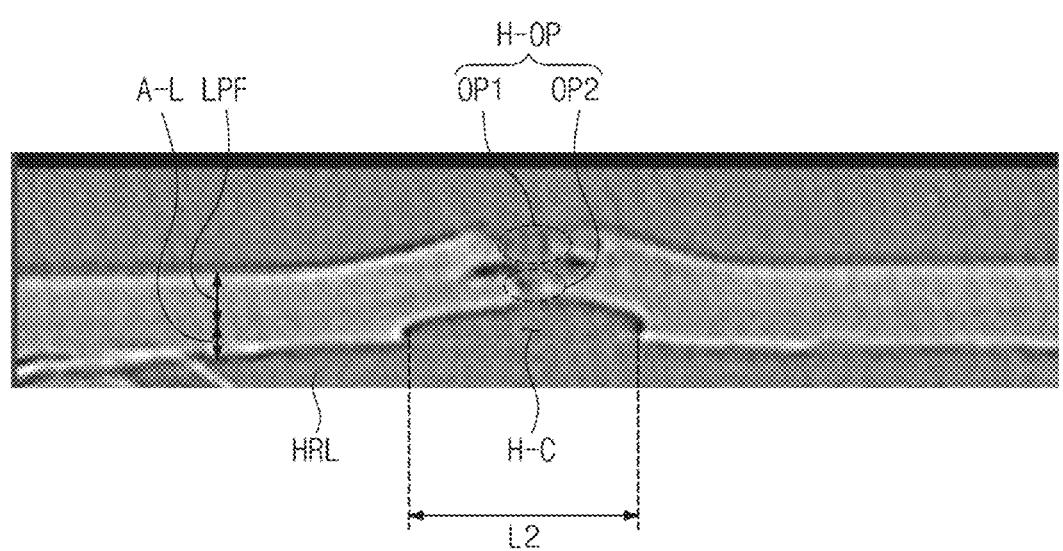
FIG. 5B is a cross-sectional view illustrating the opening region of the heat radiation sheet according to an embodiment of the invention.
Figure 5C:
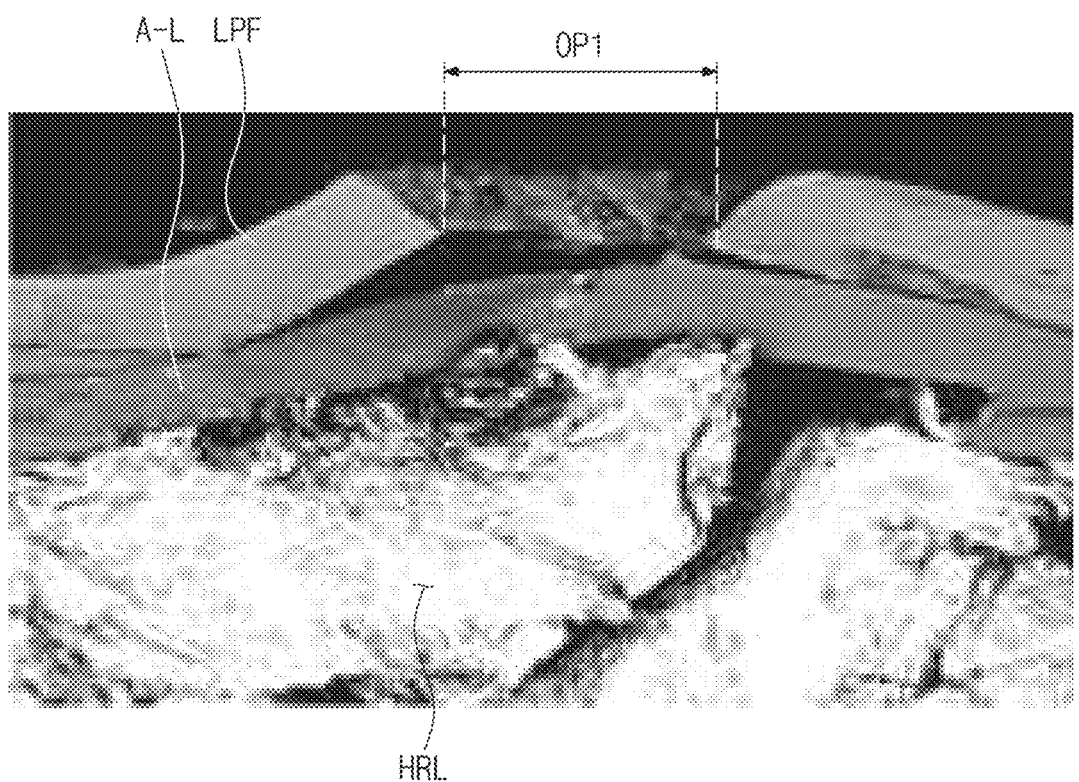
FIG. 5C is a cross-sectional view illustrating the opening region of the heat radiation sheet according to an embodiment of the invention.
Figure 5D:
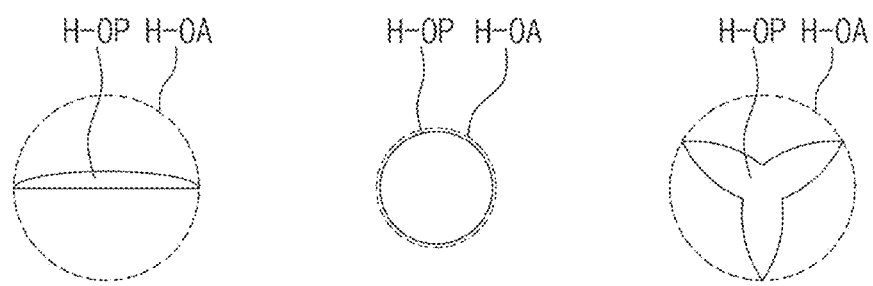
FIG. 5D is a plan view illustrating opening regions of the heat radiation sheet according to an embodiment of the invention.

FIG. 5A is an enlarged perspective view of an opening region H-OA of the heat radiation sheet HRS according to an embodiment of the invention. FIG. 5B is a cross-sectional view illustrating the opening region H-OA of the heat radiation sheet HRS according to an embodiment of the invention. FIG. 5C is a cross-sectional view illustrating the opening region H-OA of the heat radiation sheet HRS according to an embodiment of the invention. FIG. 5D is a plan view illustrating opening regions H-OA of the heat radiation sheet HRS according to an embodiment of the invention.

FIGS. 5A to 5C are photographs of the heat radiation sheet HRS including an ethylene terephthalate film disposed on opposing sides of a graphite layer. In FIG. 5A, an embodiment where a T-shaped opening H-OP is formed is shown.

In an embodiment, as illustrated in FIG. 5B, a first opening OP1 is defined or formed in the lower synthetic resin film LPF. A second opening OP2 is defined or formed in the lower adhesive layer A-L to correspond to the first opening OP1. In a process of bonding the lower protective layer LPL in which an opening H-OP formed to the heat radiation layer HRL, the lower adhesive layer A-L may be deformed due to heating or pressing. Accordingly, the first opening OP1 and the second opening OP2 may have different shapes from each other.

A partial region H-C of the lower adhesive layer A-L may be spaced apart from the heat radiation layer HRL to correspond to the opening region H-OA. In an embodiment, the opening region H-OA of the lower ethylene terephthalate film may be deformed in the process of forming the opening H-OP, such that the lower ethylene terephthalate film may not be closely attached to the heat radiation layer HRL in the opening region H-OA. As illustrated in FIG. 5B, the maximum length L2 of the partial region H-C may be greater than the maximum length of the first opening OP1 or the second opening OP2.

As illustrated in FIG. 5C, the lower adhesive layer A-L may overlap the first opening OP1. In an embodiment, as shown in FIG. 5C, the second opening OP2 may not be formed in the lower adhesive layer A-L in a case where the second opening OP2 formed by using the needles is filled with a melted adhesive material in a process in which the lower adhesive layer A-L are melted and then cured. In such an embodiment, although the second opening OP2 is not formed, air may pass through the lower adhesive layer A-L since the hot-melt adhesive layer of the lower adhesive layer A-L has monomolecular properties.

As illustrated in FIG. 5D, the opening H-OP may have a shape extending in one direction, or may have a substantially circular shape. The opening H-OP may include portions extending in three different directions. The opening H-OP may have a 'Y' shape. The shape of the opening H-OP illustrated in FIG. 5C is just an example, and the shape of the opening H-OP is not particularly limited.

Figure 6:
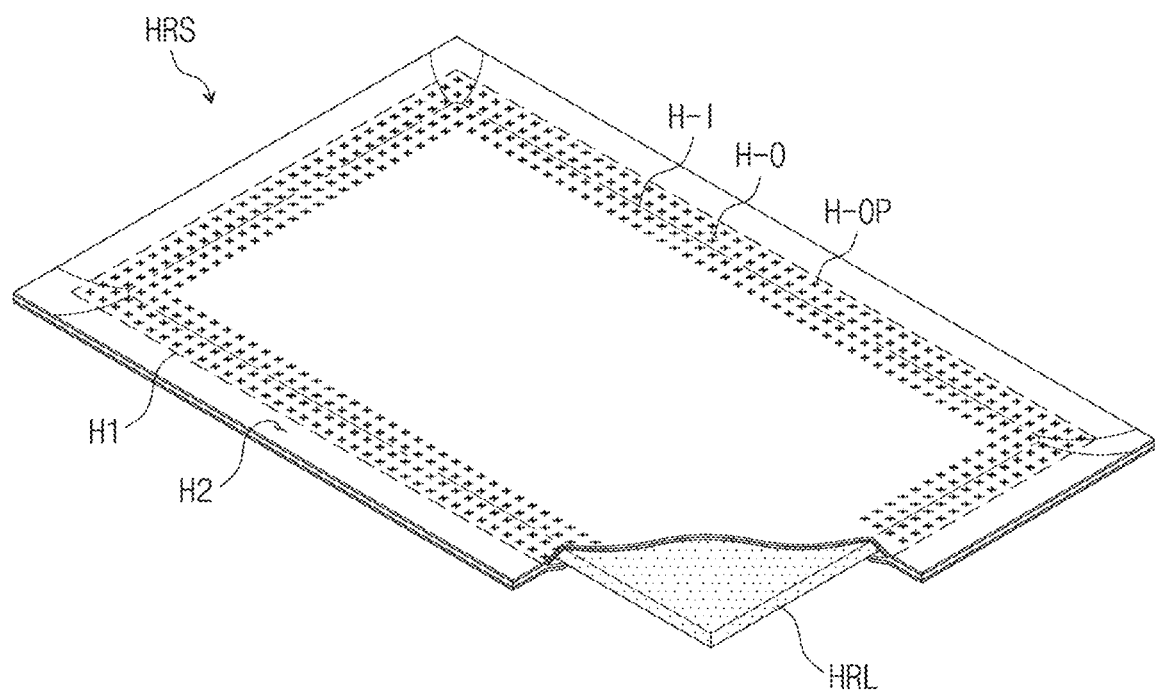
FIG. 6 is a perspective view of the heat radiation sheet according to an embodiment of the invention.
Figure 6:
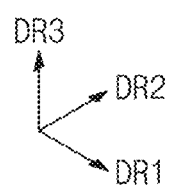

FIG. 6 is a perspective view of the heat radiation sheet HRS according to an embodiment of the invention. Hereinafter, any repetitive detailed description of the same or like elements as those described above with reference to FIGS. 1A to 5D will be omitted or simplified.

The openings H-OP may be disposed only in a partial region of the first region H1. According to an embodiment of the invention, the openings H-OP may be defined or formed in the outer region H-O. In an embodiment, as illustrated in FIG. 6, the openings H-OP may be further formed in a partial region of the inner region H-I adjacent to the outer region H-O.

Although not illustrated, according to an embodiment of the invention, the openings H-OP may be defined or formed only in a partial region of the inner region H-I adjacent to the outer region H-O.

The openings H-OP are defined or formed in a region in which pressure is concentrated between the lower protective layer LPL and the heat radiation layer HRL. In the inner region H-I, a bonding force between the lower protective layer LPL and the heat radiation layer HRL may be maintained, and in the outer region H-O, a defect which may be caused by a sudden pressure change may be prevented by the openings H-OP.

In embodiments of the invention, as described above, the openings defined or formed in the protective layer of the heat radiation sheet may easily control pressure inside the heat radiation sheet. In such embodiments, although external pressure rapidly changes during a manufacturing process of the display device or during transportation of the display device, the internal pressure of the heat radiation sheet may gradually change according to a change in external pressure. Accordingly, a defect in which the protective layer is detached from the heat radiation layer may be effectively prevented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a display panel; and
   a heat radiation sheet disposed under the display panel, wherein a first region and a second region disposed outside and surrounding the first region when viewed in a thickness direction thereof are defined in the heat radiation sheet,
   wherein the heat radiation sheet comprises:
      a heat radiation layer disposed in the first region, wherein the heat radiation layer does not overlap the second region in the thickness direction;
      a lower protective layer disposed under the heat radiation layer, wherein a plurality of openings is defined in the lower protective layer; and
      an upper protective layer placed between the display panel and the heat radiation layer, wherein a portion of the lower protective layer in the second region and a portion of the upper protective layer in the second region are coupled to each other.

2. The display device of claim 1, wherein the first region comprises:
   an inner region in which the heat radiation layer is disposed; and
   an outer region in which air is disposed.

3. The display device of claim 1, wherein the heat radiation layer comprises graphite.

4. The display device of claim 1, wherein each of the lower protective layer and the upper protective layer comprises:
   a synthetic resin film; and
   an adhesive layer disposed between the synthetic resin film and the heat radiation layer.

5. The display device of claim 4, wherein the adhesive layer comprises a hot-melt resin.

6. The display device of claim 4, wherein:
the adhesive layer is urethane-based hot-melt adhesive layer; and
the synthetic resin film is an ethylene terephthalate film.

7. The display device of claim 1, wherein the plurality of openings includes a plurality of rows of openings extending in a first direction.

8. The display device of claim 1, wherein a maximum length of each of the plurality of openings is about 1 mm or less.

9. The display device of claim 1, wherein the lower protective layer comprises:
a synthetic resin film in which first openings corresponding to the plurality of openings are defined; and
an adhesive layer disposed between the synthetic resin film and the heat radiation layer.

10. The display device of claim 9, wherein:
a partial region of the adhesive layer is spaced apart from the heat radiation layer; and
the partial region of the adhesive layer overlaps a corresponding first opening among the first openings.

11. The display device of claim 10, wherein a maximum length of the partial region of the adhesive layer is greater than a maximum length of the corresponding first opening.

12. The display device of claim 9, wherein:
a second opening is defined in a partial region of the adhesive layer; and
the second opening overlaps a corresponding one of the first openings.

13. The display device of claim 1, wherein each of the plurality of openings comprises:
a first region extending in a first direction; and
a second region extending from the first region in a second direction crossing the first direction.

14. The display device of claim 1, wherein the display panel comprises:
a base substrate;
a light-emitting element disposed on the base substrate;
a light conversion pattern disposed on the light-emitting element; and
a color filter disposed on the light conversion pattern.

15. The display device of claim 1, wherein the display panel comprises:
a first base substrate;
a light-emitting element disposed on an upper surface of the first base substrate;
a second base substrate disposed opposite to the first base substrate;
a color filter disposed on the lower surface of the second base substrate; and
a light conversion pattern disposed on a lower surface of the color filter.

16. The display device of claim 1, wherein the heat radiation layer has a porous structure.

17. A display device comprising:
a display panel; and
a heat radiation sheet disposed under the display panel, wherein a first region and a second region disposed outside the first region when viewed in a thickness direction thereof are defined in the heat radiation sheet,
wherein the heat radiation sheet comprises:
a heat radiation layer disposed in the first region;
a lower protective layer disposed under the heat radiation layer, wherein a plurality of openings is defined in the lower protective layer; and
an upper protective layer disposed above the heat radiation layer and coupled to the lower protective layer in the second region,
wherein the lower protective layer comprises:
a synthetic resin film in which first openings corresponding to the plurality of openings are defined; and
an adhesive layer disposed between the synthetic resin film and the heat radiation layer.

18. The display device of claim 17, wherein:
a partial region of the adhesive layer is spaced apart from the heat radiation layer; and
the partial region of the adhesive layer overlaps a corresponding first opening among the first openings.

19. The display device of claim 18, wherein a maximum length of the partial region of the adhesive layer is greater than a maximum length of the corresponding first opening.

20. The display device of claim 17, wherein the upper protective layer comprises:
a synthetic resin film; and
an adhesive layer disposed between the synthetic resin film of the upper protective layer and the heat radiation layer.

* * * * *